United States Patent [19]
Eguchi

[11] Patent Number: 5,444,186
[45] Date of Patent: Aug. 22, 1995

[54] MULTILAYER CONDUCTIVE WIRE FOR SEMICONDUCTOR DEVICE AND MANUFACTURING METHOD THEREOF

[75] Inventor: Koji Eguchi, Hyogo, Japan

[73] Assignee: Mitsubishi Denki Kabushiki Kaisha, Tokyo, Japan

[21] Appl. No.: 933,633

[22] Filed: Aug. 24, 1992

[30] Foreign Application Priority Data

Oct. 22, 1991 [JP] Japan .................................. 3-273935
Jun. 11, 1992 [JP] Japan .................................. 4-152044

[51] Int. Cl.⁶ .............................................. H05K 1/00
[52] U.S. Cl. ...................................... 174/250; 174/268; 257/747; 257/748; 257/750; 257/775
[58] Field of Search ................ 174/250, 268; 257/747, 257/748, 750, 774, 775, 776

[56] References Cited

U.S. PATENT DOCUMENTS

| | | |
|---|---|---|
| 4,937,641 | 6/1990 | Sunami et al. . |
| 5,023,699 | 6/1991 | Hara et al. . |
| 5,084,412 | 1/1992 | Nakasaki . |
| 5,103,268 | 4/1992 | Yin et al. . |

FOREIGN PATENT DOCUMENTS

| | | |
|---|---|---|
| 0340727A3 | 11/1989 | European Pat. Off. . |
| 0407133A2 | 1/1991 | European Pat. Off. . |
| 0407933A3 | 1/1991 | European Pat. Off. . |
| 0499063A2 | 8/1992 | European Pat. Off. . |
| 57-45259 | 3/1982 | Japan . |
| 2-186634 | 7/1990 | Japan . |
| 2206234 | 12/1988 | United Kingdom . |

OTHER PUBLICATIONS

Patent Abstracts of Japan, vol. 11, No. 227 (E-526), Jul. 23, 1987 (JP62045150).
Patent Abstracts of Japan, vol. 15, No. 375 (E-1114), Sep. 20, 1991 (JP3149829).
Patent Abstracts of Japan, vol. 15, No. 375 (E-1114), Sep. 20, 1991 (JP3149828).

*Primary Examiner*—Leo P. Picard
*Assistant Examiner*—Cheryl R. Figlin
*Attorney, Agent, or Firm*—Lowe, Price, LeBlanc & Becker

[57] ABSTRACT

A multilayer conductive wire is formed of a plurality of conductive layers stacked upon each other, and has a slit shaped groove extending in the direction intersecting the direction of stress in at least one conductive layer. With the groove mating with a protrusion in another conductive layer or a protrusion in an insulating film layer, a sliding phenomenon between the layers due to the stress can be restrained, so that a multilayer conductive wire free from destruction due to the sliding phenomenon caused by the stress and without losing conductivity can be provided.

39 Claims, 18 Drawing Sheets

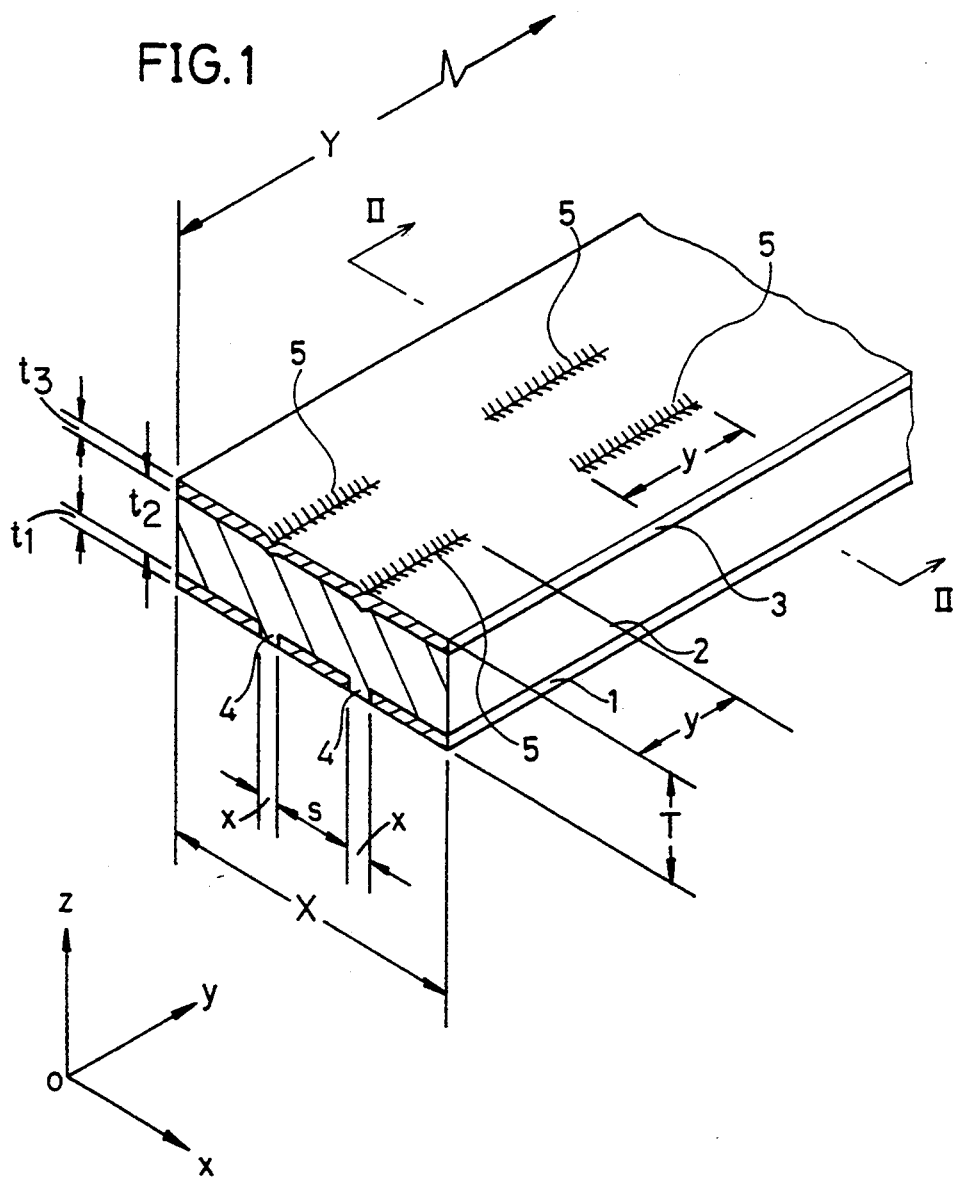

MULTILAYER CONDUCTIVE WIRE FOR SEMICONDUCTOR DEVICE AND MANUFACTURING METHOD THEREOF

BACKGROUND OF THE INVENTION

1. Field of the Invention

The present invention relates generally to a multilayer conductive wire for semiconductor device formed of two or more conductive layers, and more specifically, to a highly reliable multilayer conductive wire free from stress migration and without losing conductivity.

2. Description of the Background Art

The background art will be described in conjunction with the drawings.

A conventional multilayer conductive wire is, for example, of a three-layer structure as shown in FIG. 16 (Japanese Patent Laying-Open No. 2-186634, etc.). Referring to FIG. 16, the conventional multilayer conductive wire is formed of a barrier metal layer 1 formed of a metal such as TiN and TiW having a thickness of about 1000Å, an aluminum alloy layer 2 of, for example, Al—Si—Cu, and Al—Cu, with a thickness in the range between 5000Å and 10000Å formed on its surface by sputtering, and a metal layer 3 of, for example, Ti, Mo, W with a thickness of about 1000Å formed on the surface thereof by sputtering, etc., on which an interlayer insulating film (not shown) is formed.

Such a multilayer conductive wire is mainly used for a conductive wire tolerating a large current and needed to have its width reduced such as a power supply wire for, for example, an LSI (Large Scale Integrated Circuit).

Metal layer 3 formed of metal such as Ti is formed on the surface of aluminum alloy layer 2 to form a three-layer structure, because a wire of two-layer structure without the layer overlying aluminum alloy layer 2 in other words without metal layer 3 is encountered with the following problem when an interlayer insulating film is directly formed on the surface thereof.

As shown in FIG. 19, suppose that a conductive wire 43 formed of an aluminum alloy is formed covering the surface of a stepped portion produced in the formation of an insulating layer 42 on a silicon substrate 41, and an interlayer insulating film 44 of $SiO_2$ is further formed thereon. When the structure is supplied with a resist film 45 of positive type in order to form a via hole in interlayer insulating film 44 at the upper part of the stepped portion and is subjected to photolithography, light transmitted through resist film 45 and interlayer insulating film 44 at the time of exposure reflects irregularly as indicated by the arrows B and C upon the surface of conductive wire 43 which is highly reflective. As a result, when an opening 46 having a width represented by the double dotted chain is formed, the resist is excessively developed as far as the position 46a shown by the broken line and removed away. Consequently, the region of interlayer insulating film 44 to be subsequently etched becomes larger than the area of the opening of a desired via hole. This is a so-called notching phenomenon. Conversely, as shown in FIG. 16, formation of metal layer 3 such as Ti having lower light reflectivity than aluminum alloy on aluminum alloy layer 2 prevents the notching phenomenon due to the reflection of the light upon the exposure in the process of photolithography.

Also, when an insulating film of, for example, $SiO_2$ is deposited on the conductive wire with the surface of aluminum alloy layer exposed thereon and a via hole is formed therein, especially in the case of a DRAM (Dynamic Random Access Memory) of a megabit class, about several ten% overetching is necessary in forming a via hole of submicron level. The overetching is conducted with the surface of aluminum alloy layer at the bottom of the via hole being exposed, a polymer is synthesized by the aluminum alloy, resist and a plasma containing a gas etching an oxide film. The polymer sticking to the inner wall of the via hole often gives rise to a disconnection of a conductive wire in connecting the same through the via hole in a succeeding process or results in poor coverage.

Referring to FIGS. 17A to 17D, a description will be provided on the mechanism of the disconnection of a conductive wire in connecting the same in the via hole due to the synthesization of the polymer.

Referring to FIG. 17A, when a silicon oxide film 32 is formed on an aluminum alloy wire layer 31 formed on an insulting layer 30 by means of CVD (Chemical Vapor Deposition), a resist film 33 with an opening 34 is formed, and then etching is conducted in order to form a via hole 35 in silicon oxide film 32, three condition for the aluminum alloy, resist and a gas for etching oxide film are satisfied while aluminum alloy conductive layer 31 is overetched, and, therefore, a polymer 36 is deposited on the inner walls of via hole 35 and opening 34. The upper end portion of polymer 36 remains as shown in FIG. 17C after resist film 33 is removed away. Therefore, deposition of conductive metal layers 37a and 37b such as aluminum for wire connection with aluminum alloy layer 31 by means of sputtering in via hole 35 causes conductive metal layers 37a and 37b cut off by the presence of polymer 36, thereby rendering the layers disconnected.

A problem due to a polymer as stated above will not arise in the case of multilayer conductive wire shown in FIG. 16, because the overetching is not conducted with the surface of aluminum alloy layer 2 being exposed.

However, a conventional multilayer conductive wire as shown in FIG. 16 is still encountered with the following problem.

When a conventional multilayer conductive wire as shown in FIG. 16 is disposed covered with a passivation film in the periphery of a semiconductor device region formed on a rectangular semiconductor chip, sealing thereon with further resin causes strong stress to be concentrated on the four corners of the periphery of the chip due to the difference, etc. in the amounts of shrinkage by dehydration between the mold resin and the passivation film at the time of heat-treatment. Therefore, cracks are produced in the passivation film at those positions, and sliding is caused between the joint of the layers of multilayer conductive wire, thereby destroying the wire.

The cause for this sliding phenomenon between the layers will be described in conjunction with FIG. 21. A cross section shown in FIG. 21 is formed by providing a passivation film 81 on the conventional multilayer conductive wire shown in FIG. 16 and by further covering the same with mold 82. At the interface S1 between mold 82 and passivation film 81, when the difference in the amounts of heat shrinkage at the time of heat-treatment is large between mold 82 and passivation film 81, sliding takes place due the stress caused by the difference. When no sliding takes place at the interface S1 and the difference in the heat-shrinkage amounts between passivation film 81 and the metal layer 3 is relatively large, sliding takes place at the interface S2. In this case, sliding sometimes takes place at interface S3 or interface S4 not at interface S2. Also, at interfaces S3 and S4, sliding sometimes takes place due to the difference in the degrees of temperature rising at the time of conduction caused by the difference in electrical resistance between metal layer 3 and aluminum alloy layer 2 or between aluminum alloy layer 2 and barrier metal 1.

It has been demonstrated by experiments that cracks are likely to be formed in the passivation film at the upper portion of a conductive wire or its periphery and the larger the width of the conductive wire, the more frequent cracks are formed. This is because the passivation film and the mold resin greatly shrink by dehydration, etc. in accordance with heat-treatment, while aluminum alloy, etc. is not deformed very much, and, therefore force due to the stress would act upon these interfaces, the force increasing as a function of the area of these interfaces.

One approach directed to solution of such a problem due to application of stress into the periphery of a chip is disclosed, for example, in Japanese Patent Laying-Open No. 57-45259. The semiconductor device disclosed in the document, referring to FIGS. 18A and 18B, includes a semiconductor element region 13 formed on a silicon substrate 11 of a first conductivity type and having its elements isolated by a field insulating film 12. The surface of semiconductor element region 13 is covered with a thin first surface insulating film 14, and the surfaces of first surface insulating film 14 and field insulating film 12 are further covered with a second surface insulating film 15. Provided on the surface of second surface insulating film 15 are an aluminum wire 16, a bonding pad 17, and a guard ring 18. Aluminum wire 16 comes into ohmic contact with semiconductor element region 13 in a through hole 19 formed in the first and second surface insulating films 14 and 15. Guard ring 18 of a aluminum film is formed along the periphery of silicon substrate 11, and when connected to a ground terminal, prevents an inversion layer from being formed. A slit 20 is provided at a corner of guard ring 18, and the effect of stress concentration is relaxed at the corner, because the width of guard ring 18 is reduced by the width of slit 20. Consequently, formation of cracks in passivation film 21 can be restrained.

However, when a slit is formed in a conductive wire in the periphery of a chip by applying the above-stated conventional technique, the cross-sectional area of the conductive wire at that position is reduced by the area of the slit, so that electrical resistance as the conductive wire increases in proportion to the reduction. In Conductor portions on the opposing sides of the slit (FIG. 18A), conductive wire portions (18a and 18b) extending in parallel with guard ring 18 at the position where the slit 20 is formed has an outer portion (conductive wire portion 18a in FIG. 18A) significantly longer than its inner portion (conductive wire portion 18b in FIG. 18A) even with the cross-sectional widths being identical. Therefore, with difference being generated in the resistance values of these portions, and, therefore the distribution of joule heat when current flows therethrough will be different. Local heat-stress takes place due to the uneven temperature distribution, thereby disconnecting the wires.

SUMMARY OF THE INVENTION

It is therefore an object of the present invention to provide a multilayer conductive wire having sufficient strength against stress which can prevent a sliding phenomenon at the joint between layers by stress migration without causing disconnection by polymer synthesization and yet without increasing electric resistance.

In order to achieve the above-stated object, a multilayer conductive wire according to the present invention has a two-layer or more multilayer wire at least including first and second conductive layers joined with each other, and a groove of a prescribed shape is formed from the joint of the first conductive layer and the second conductive layer to a prescribed depth. In the multilayer conductive wire including the structure in which the groove mates with a protrusion provided in the second conductive layer, a metal layer having lower light reflectivity than aluminum alloy layer is joined to the top of aluminum alloy layer, and, therefore, a so-called notching phenomenon due to the reflection of the light at the time of the exposure in the process of photolithography can be prevented. The groove formed in the first conductive layer mates with the protrusion formed in the second conductive layer, thus preventing the sliding phenomenon at the joint between the first and second conductive layers, even upon the occurrence of stress. Furthermore, the groove is filled with a conductive material, and, therefore, the cross-sectional area is not substantially reduced by forming the groove. The rising of electric resistance as the conductive layer can be restrained.

The groove formed in the first conductive layer is preferably formed as to extend in the direction approximately intersecting the direction of the stress applied upon the multilayer conductive wire. Such a structure permits the stress to be efficiently absorbed.

Also, a multilayer conductive wire according to the present invention further includes the one having the surface of the first conductive layer opposite to the surface joined to the second conductive layer covered with an oxide film for insulation, and provided with a via hole in the oxide film for electrically connecting the first conductive layer and other conductive wires only in the region in which the groove is not formed. By this structure, the surface of aluminum alloy layer will not be exposed in the formation of the via hole, and, therefore polymer synthesization can be prevented.

A multilayer conductive wire according to the present invention in another aspect has a two-layer or more multilayer wires at least including a first conductive layer and a second conductive layer joined with each other, and includes a structure in which a groove of a prescribed shape formed from the joint of the first conductive layer and second conductive layer to a prescribed depth mates with a protrusion provided in an insulating covering layer for securing insulation with other conductive wires. In the structure, with the groove being filled with an insulating material, the rising of electric resistance can not be restrained but the sliding phenomenon between the insulating covering layer and the multilayer conductive wire upon the occurrence of stress or the formation of cracks in the insulating covering layer due to stress absorption can be prevented.

As described above, according to the present invention, a groove is formed in a layer having a conductivity forming a multilayer conductive wire, a conductive material of a conductivity different from the layer or an insulating material fills the groove, and, therefore, sliding phenomena between the conductive wires due to the stress can be restrained at the position of the groove.

A conductive wire less subject to destruction by the sliding phenomenon can be formed when the multilayer conductive wire is formed at the position where stress is likely to be generated, for example, in the periphery of a semiconductor chip.

Also, formation of the groove extending in the direction intersecting the direction of the stress can efficiently restrain the sliding phenomenon due to the stress.

Furthermore, keeping a via hole from being formed in the position where a groove is to be formed, synthesization of a polymer can be prevented in the formation of the via hole, thereby preventing disconnection, etc. of a conductive wire to be connected with the multilayer conductive wire in the via hole.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a partially sectional perspective view showing a multilayer conductive wire in a first embodiment of the present invention.

DESCRIPTION OF THE PREFERRED EMBODIMENTS

Figure 2A:
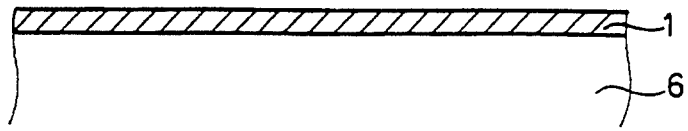
FIGS. 2A, 2B, 2C, 2D and 2E are sectional views sequentially showing a process of forming the multilayer conductive wire shown in FIG. 1.

The first embodiment of the present invention will be described in conjunction with FIGS. 1, 2A to 2E, and FIGS. 3A and 3B.

The present multilayer conductive wire, referring to FIG. 1, is formed of a barrier metal layer 1 with a plurality of slit-shaped grooves 4 extending in the lengthwise direction formed penetrating from the top to the bottom, and an aluminum alloy layer 2 formed thereon. Groove 4 just mates with a protrusion formed in the joint of aluminum alloy layer 2 and barrier metal layer 1. More specifically, groove 4 is filled with the aluminum alloy which is a conductor. Provided on the surface of aluminum alloy layer 2 is an alloy layer 3 having smaller light reflectivity than the aluminum alloy for the purpose of preventing notching from taking place. A recess 5 is formed at the position corresponding to the groove 4 of metal layer 3. A high-melting point metal such as tungsten is used for a material for metal layer provided in a thickness 3.

The total width along the O-z axis of the multilayer wire structure thus formed is "W" and the total thickness is $$T = t_1 + t_2 + t_3.$$

As best seen in FIG. 1, grooves 4,4 are separated by a distance "s".

Preferable sizes for the respective parts of the multilayer conductive wire in this embodiment and are given in Table 1.

TABLE 1

| | Size Values |
|---|---|
| w | 10–20 μm |
| $t_1$ | 100–1000Å |
| $t_2$ | 5000–10000Å |
| $t_3$ | 500–2000Å |
| x | 1–2 μm |
| y | 1.0–2.0 times x |
| z | 10–100 μm |

Figure 2B:
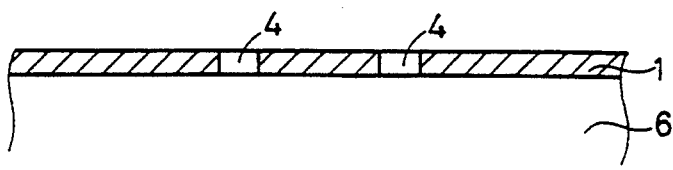
Figure 2C:
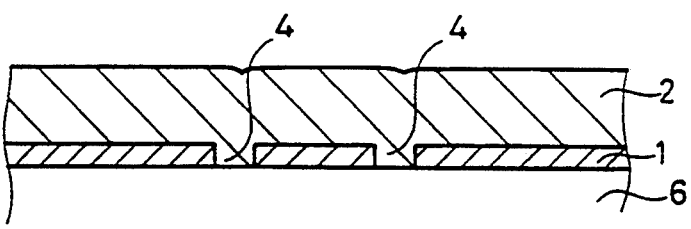
Figure 2D:
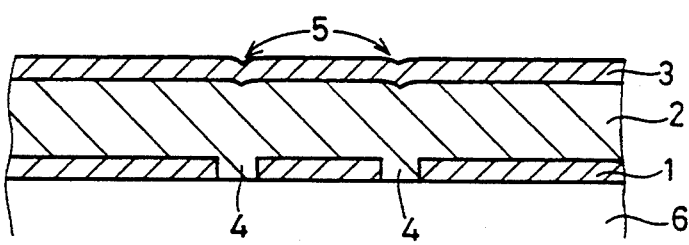

The multilayer conductive wire shown in FIG. 1 is formed by the process shown in FIGS. 2A to 2E. More specifically, a metal such as TiN and TiW is deposited by sputtering on the entire surface of an insulating layer 6 to be an underlaying and a barrier metal layer 1 having a thickness of about 1000Å is formed (FIG. 2A). Subsequently, groove 4 is formed at a prescribed position of barrier metal layer 1 by means of photolithography and etching (FIG. 2B). Then, an aluminum alloy such as Al—Si(1%)—Cu(0.5%), and Al—Cu is deposited to form an aluminum alloy layer 2 having a thickness in the range between 5000Å and 10000Å thereon (FIG. 2C). Subsequently, any one of W, Mo, Ti, Nb, etc. is deposited by sputtering and a metal layer 3 having a thickness of about 1000Å is formed thereon (FIG. 2D).

Figure 2E:
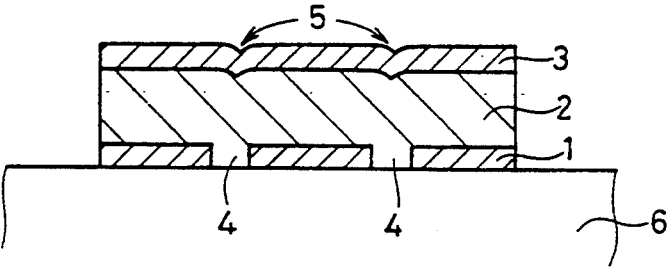

Then, unnecessary portions of barrier metal layer 1, aluminum alloy layer 2 and metal layer 3 are removed by means of photolithography and etching, thus providing a desired conductive wire pattern (FIG. 2E).

Figure 3A:
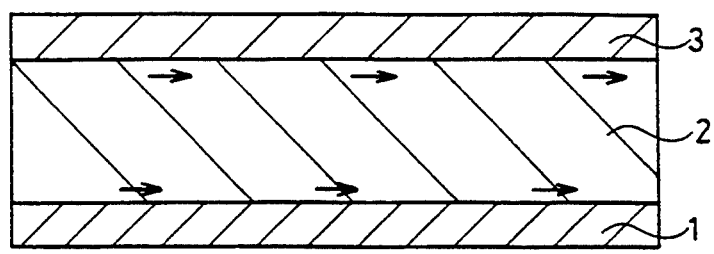
FIG. 3A is a sectional view for illustrating how easily the sliding phenomenon takes place in the joint of a conventional multilayer conductive wire shown in FIG. 16 due to stress.
Figure 3B:
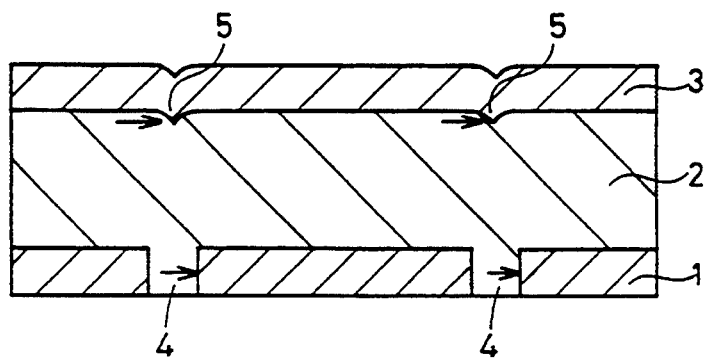
FIG. 3B is a sectional view for illustrating restraint against the sliding phenomenon of the multilayer conductive wire due to the stress in the first embodiment of the present invention shown in FIG. 1.
Figure 16:
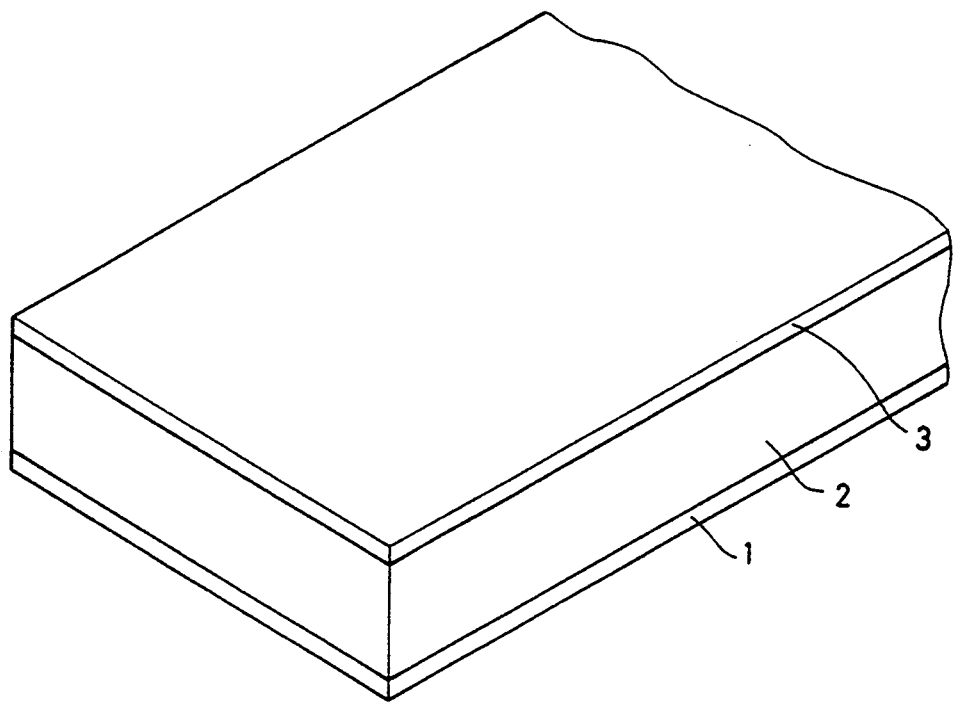
FIG. 16 is a perspective view showing a conventional three-layer multilayer conductive wire.
Figure 17A:
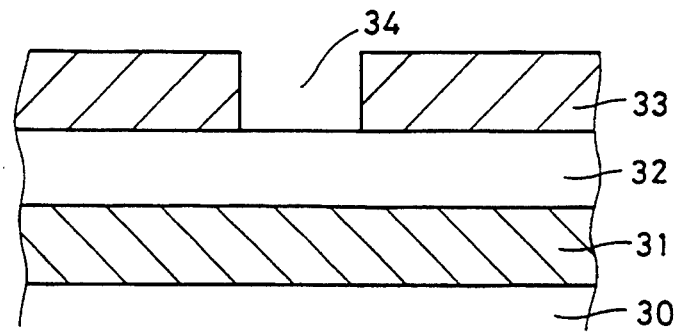
FIGS. 17A, 17B, 17C and 17D are sectional views sequentially showing the mechanism in which a polymer is synthesized and disconnection is thereby caused when a via hole is formed in a silicon oxide film covering the surface of a single layer conductive wire formed of an aluminum alloy, and a conductive metal layer is further formed thereon.
Figure 17B:
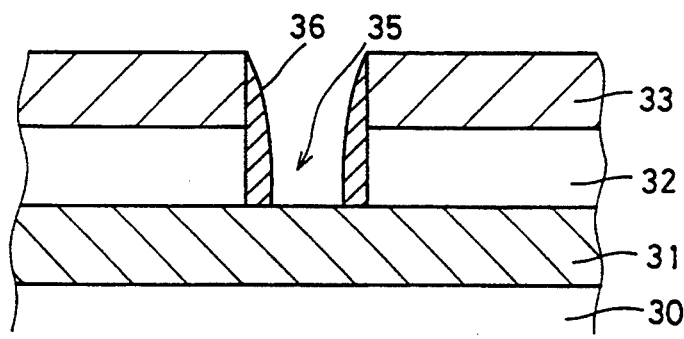
Figure 17C:
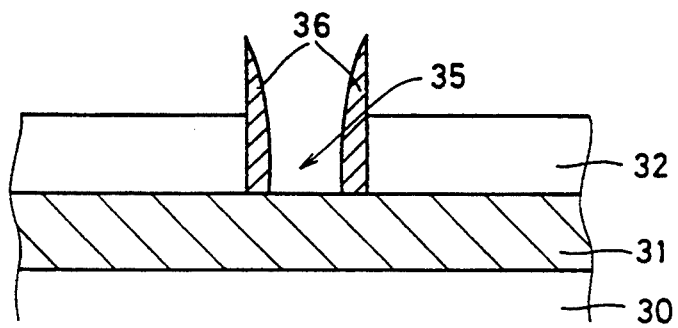
Figure 17D:
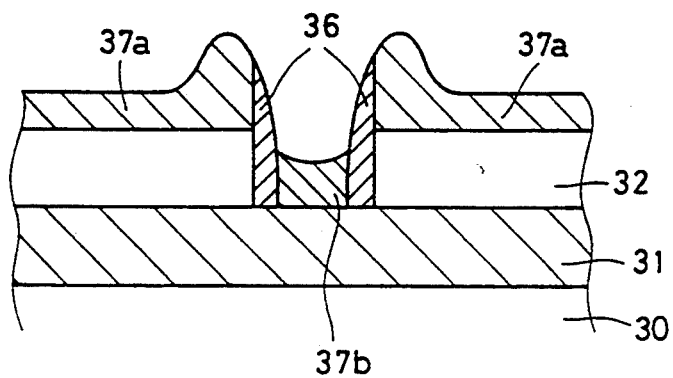

The difference in effect and function between thus formed multilayer conductive wire and the conventional multilayer conductive wire shown in FIG. 16 will be described as follows in conjunction with FIGS. 3A and 3B. In the case of the conventional multilayer conductive wire, as the cross-section being shown in FIG. 3A, sliding is more likely takes place in the joint of the layers when stress acts upon the direction indicated by the arrows. In the case of the multilayer conductive wire of the present embodiment, as shown in FIG. 3B, groove 4 and recess 5 function to restrain the sliding phenomenon. Therefore, upon the occurrence of stress in the direction perpendicular to the lengthwise direction of grooves 4, the multilayer structure is unlikely to be destroyed due to the sliding. Furthermore, groove 4 is filled with a conductive material, and, therefore, the electrical resistance of the multilayer conductive wire will not increase.

The second embodiment of the present invention will be described in conjunction with FIG. 4. In the case of the multilayer conductive wire according to the present invention, referring to FIG. 4, slit shaped groove 14 is formed penetrating aluminum alloy layer 2, without providing the groove as stated above in barrier metal layer 1, metal layer 3 is formed thereon, and the same material as metal layer 3 fills groove 14 when metal layer 3 is formed by sputtering, etc. Therefore, as in the case of the above-described first embodiment, sliding can be restrained in the joint. The electrical resistance of the multilayer conductive wire is not increased as in the case of the first embodiment.

Elements provided with the same reference numerals and characters are the same as the above-stated first embodiment in material and formation method in the present embodiment as well as the following embodiments.

The third embodiment of the present invention will be described in conjunction with FIG. 5. The present multilayer conductive wire, referring to FIG. 5, includes slit shaped groove 24 penetrating both barrier metal layer 1 and aluminum alloy layer 2, and metal layer 2 formed thereon. As is the case with the above-stated second embodiment, a metal of the same material quality as metal layer 3 fills groove 24 when metal layer 3 is formed by sputtering, etc.

The fourth embodiment of the present invention will be described in conjunction with FIG. 6. The present multilayer conductive wire, referring to FIG. 6, includes grooves 34 formed from the top of aluminum alloy layer 2 to a prescribed depth, and metal layer 3 formed thereon. Also in the present embodiment, a metal of the same material quality as metal layer 3 fills grooves 34 when metal layer 3 is formed by sputtering, etc. The present embodiment is different from the above-stated first to third embodiments in that the depth of grooves 34 should be controlled in the process of etching in the formation of grooves 34.

Also, in the above-described third and fourth embodiments, a conductive metal of the same material quality as metal layer 3 fills grooves 24 and 34, the provision of grooves will not increase the electric resistance at the positions.

The fifth embodiment of the present invention will be described in conjunction with FIG. 7. The present multilayer conductive wire, referring to FIG. 7, includes grooves 4 in barrier metal layer 1 as is the case with the above-described first embodiment, grooves 4 in metal layer 3 which correspond to the positions of grooves 44. In the present embodiment, the multilayer conductive wire is formed, and then grooves 44 are filled with an interlayer insulating film or a passivation film when the interlayer insulating film or passivation film for covering the wire is formed. Therefore, recesses 5 existing under groves 44 are also filled with the material of the interlayer insulating film or the passivation film, thereby providing restraint against sliding at these positions. In the case of the present embodiment, groove 44 is not filled with a conductive metal, but with an insulating material, so that the electric resistance increases by the amount corresponding to the cross-sectional area of grooves 44, but the increase of the electric resistance is negligibly insignificant because the area is insignificant relative to the entire cross sectional area of the multilayer conductive wire.

Therefore, in the present embodiment, the restraint of sliding phenomenon can be provided especially between the interlayer insulating film or passivation film and the multilayer conductive wire, with almost no increase of electric resistance. Consequently, cracks are less likely to be formed in the passivation film.

Figure 8:
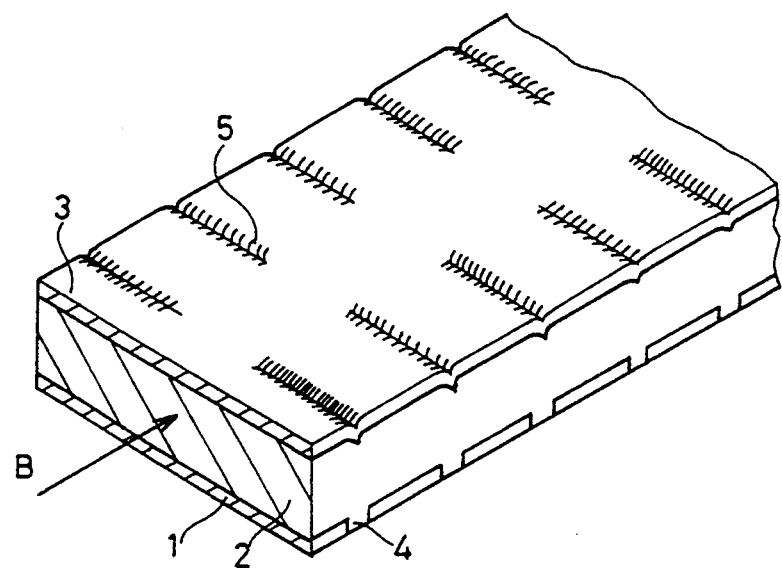
FIG. 8 is a partially sectional perspective view showing a multilayer conductive wire according to a sixth embodiment to the present invention.

The sixth embodiment of the present invention will be described in conjunction with FIG. 8. The present multilayer conductive wire, referring to FIG. 8, includes slit shaped grooves 4 extending in the direction intersecting the lengthwise direction of the conductive wire and penetrating barrier metal layer 1. The present multilayer conductive wire is applied when stress acts upon the lengthwise direction of the conductive wire in other words in the direction represented by the arrow B shown in FIG. 8. As described above, the formation of the slit shaped groove in barrier metal layer 1 extending in the direction intersecting the direction in which the stress acts upon can restrain sliding between the layers due to the stress from taking place. Similar functions and effects can be provided by applying this idea to the above-stated second to fifth embodiments thereby changing the directions in which grooves 14, 24, 34 and 44 are formed.

Figure 9:
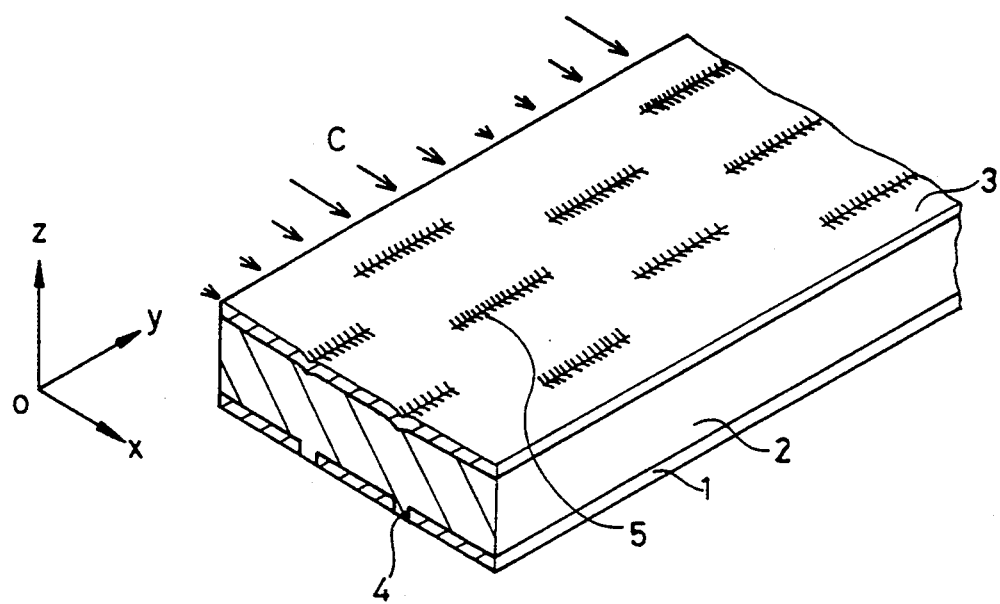
FIG. 9 is a partially sectional perspective view showing a multilayer conductive wire according to a seventh embodiment of the present invention.

Now, the seventh embodiment of the present invention will be described in conjunction with FIG. 9. The present multilayer conductive wire, referring to FIG. 9, is the same as the above-stated first embodiment in that slit shaped grooves 4 are formed in barrier metal layer 1 in the direction in which the conductive wire extends. The present invention is different from the above-stated first embodiment in that the number of grooves 4 is changed in accordance with the strength distribution of stress shown by the arrow C shown in FIG. 9. In other words, three rows of grooves 4 are formed at the position where strong stress is applied in barrier metal layer 1 and two rows of grooves 4 are formed at the position where weak stress is applied in barrier metal layer 1. Thus, stronger restraint is provided at the position more likely to be subject to sliding due to the strong stress.

Figure 18A:
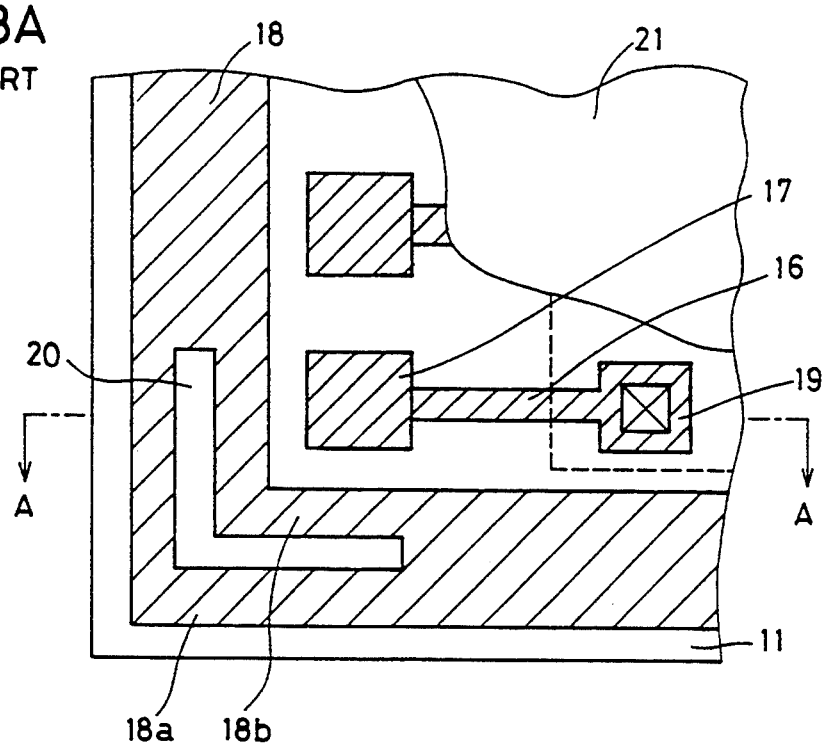
FIG. 18A is a partially top plan view showing a conventional semiconductor device with a solution to a problem due to the occurrence of stress in the periphery of a chip.
Figure 18B:
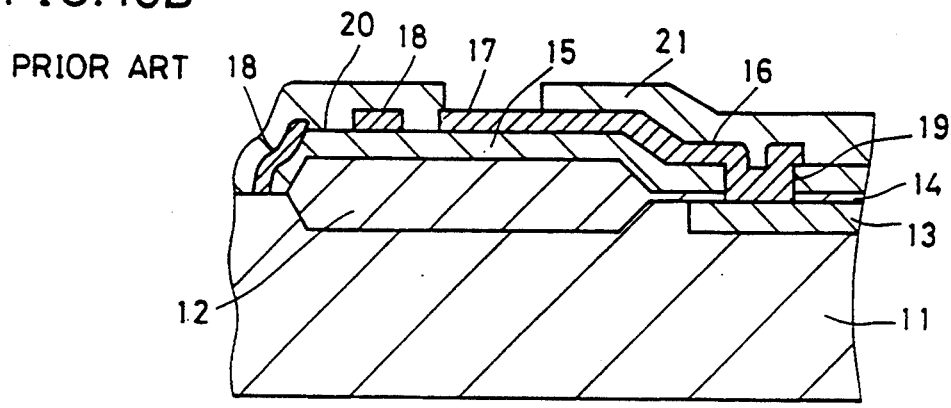
FIG. 18B is a sectional view taken along line A—A in FIG. 18A.
Figure 19:
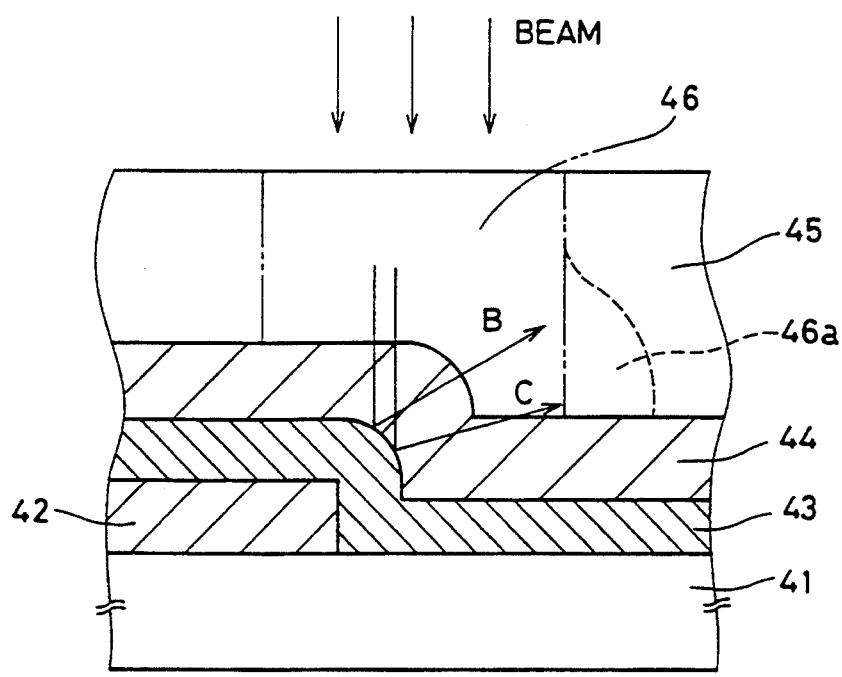
FIG. 19 is a partially sectional view for illustrating a problem associated with the formation of a contact hole when an interlayer insulating film is directed formed on the surface of an aluminum alloy and the contact hole is provided in the interlayer insulating film.
Figure 23A:
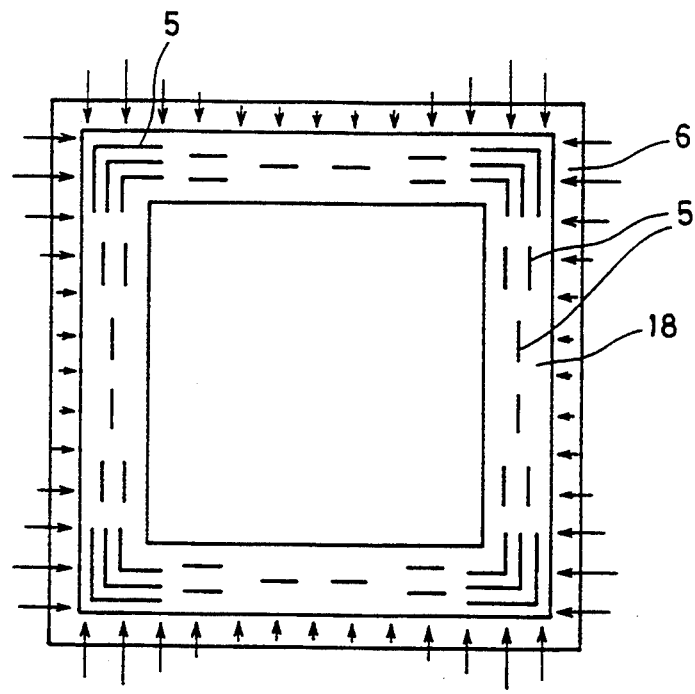
FIG. 23A showing an application of the multilayer conductive wire in accordance with the seventh embodiment of the present invention for a guard ring in the periphery of a chip.
Figure 23B:
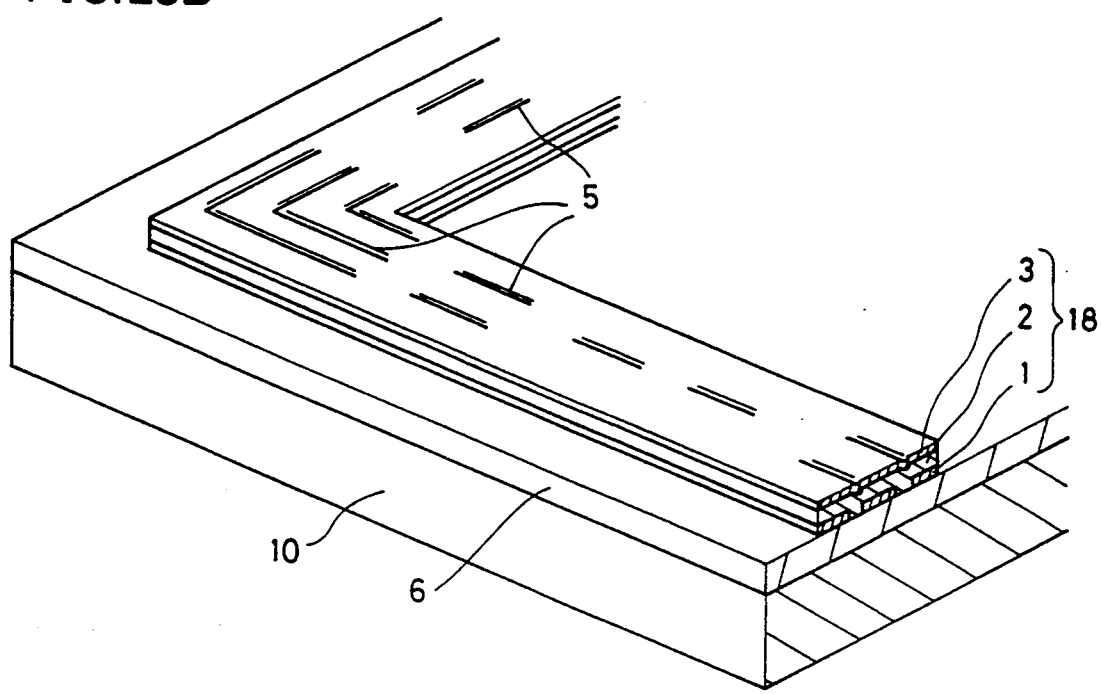
FIG. 23B is a partially cross sectional and enlarged perspective view thereof.

The present embodiment can effectively applied to guard ring 18 which is a conductive wire in the periphery of the chip illustrated in the above description of prior art technology in conjunction with FIG. 18. More specifically, as shown in FIG. 23A and 23B, guard ring 18 formed on a surface of insulating layer 6 on chip substrate 10 is formed to have a three-layer structure similar to the present embodiment, and as the distribution of thermal stress increases in portions close to four corners of the chip (illustrated by the arrow in FIG. 23A), "<" shaped slits (not shown) are formed only at the four corner portions of guard ring 18. Since the thermal stress distribution decreases other than at the four corner portions of guard ring 18, the number of slits is reduced from 2 to 1. Recesses 5 are formed on a surface of metal layer 3 at the positions corresponding to these slits. Thus, providing a number of slits at the four corner portions of guard ring 18 prevents a sliding phenomenon in the portions susceptible to thermal stress.

Figure 10:
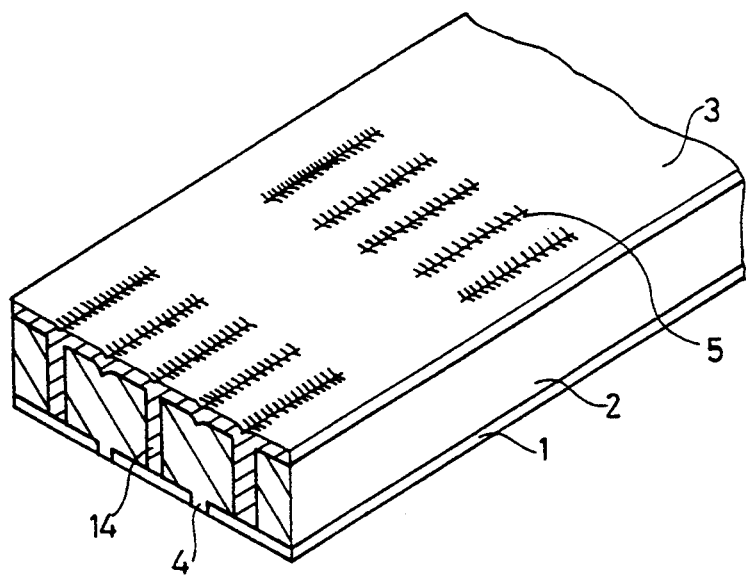
FIG. 10 is a partially sectional perspective view showing a multilayer conductive wire according to an eighth embodiment of the present invention.

The eighth embodiment of the present invention will be described in conjunction with FIG. 10. The first embodiment and the second embodiment are combined in the multilayer conductive wire of the present embodiment. More specifically, the present multilayer conductive wire, referring to FIG. 10, includes grooves 4 penetrating barrier metal layer 1, and grooves 14 formed penetrating aluminum alloy layer 2 in the direction in which the conductive wire extends. Groove 4 is filled with an aluminum alloy, and groove 14 is filled with a metal of the same material quality as metal layer 3. Recesses 5 in this case are formed at positions corresponding to both grooves 4 and 14. According to the present invention, a multilayer conductive wire having stronger restraint against stress acting upon in the direction intersecting the lengthwise direction of the conductive wire can be formed.

Figure 11:
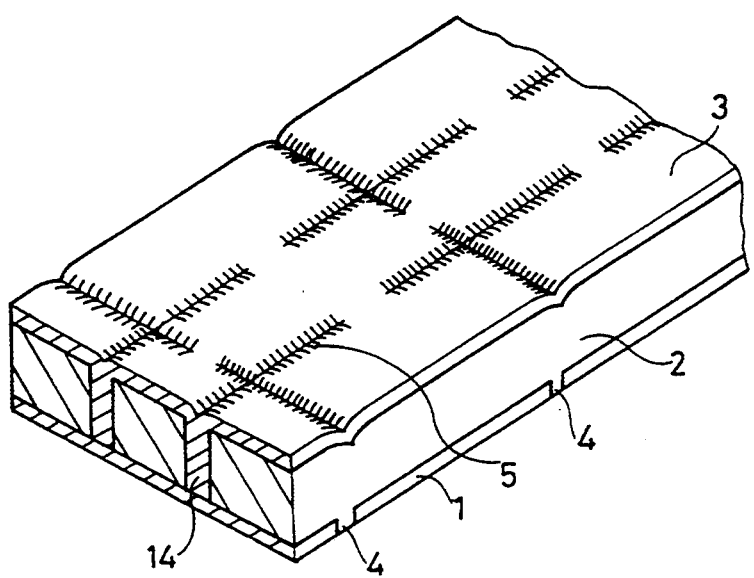
FIG. 11 is a partially sectional perspective view showing a multilayer conductive wire according to a ninth embodiment of the present invention.

The ninth embodiment of the present invention will be described in conjunction with FIG. 11. The present multilayer conductive wire is formed by combining the second embodiment and sixth embodiment. More specifically, the present multilayer conductive wire, referring FIG. 11, includes grooves 4 penetrating barrier metal layer 1 in the direction intersecting the lengthwise direction of the conductive wire and grooves 14 penetrating aluminum alloy layer 2 in the direction extending in the lengthwise direction of the conductive wire. Also in the present embodiment, recesses 5 are formed at positions corresponding to both grooves 4 and 14. The placement of grooves 4 and 14 of the present embodiment permits both function and effect of the first and sixth embodiments to be achieved at a time. More specifically, when stress acts upon in the lengthwise direction of the conductive wire and the direction intersecting the direction, restraint against sliding due to these two kinds of stress can be provided.

The tenth embodiment of the present invention will be described in conjunction with FIG. 12. The multilayer conductive wire of the present invention, referring to FIG. 12, projections 54 are similarly formed on the surface of barrier metal 1 extending in the lengthwise direction of the conductive wire. Aluminum alloy layer 2 is formed on the top of barrier metal layer 1, and aluminum alloy layer 2 fills the region between the two projections 54 and, and the region surrounding the projections 54. Protrusions 55 extending in the lengthwise direction of the conductive wire at the positions corresponding to projections 54 are formed in metal layer 3 formed on the surface of aluminum alloy layer 2. The structure of the present multilayer conductive wire can be interpreted as that slit shaped grooves of a prescribed depth are formed with aluminum alloy layer 2 underneath and the barrier metal layer fills the grooves, instead of thinking that projections 54 are formed in barrier metal layer 1.

According to the present embodiment, as in the case of the first embodiment, the restraining effect against sliding between the layers due to stress acting in the direction intersecting the lengthwise direction of the conductive wire is provided at the positions of projections 54 and protrusions 55.

The eleventh embodiment of the present invention will be described in conjunction with FIG. 13. The present multilayer conductive wire, referring to FIG. 11, includes projections 64 serially formed on the surface of barrier metal layer 1 extending in the lengthwise direction of the conductive wire and reaching the bottom of metal layer 3. In the present embodiment, the top surface of aluminum alloy layer 2 is formed to be flush with the top surface of protrusion 64, on which metal layer 3 is formed, and nothing corresponding to protrusions 55 shown in FIG. 12 is formed. However, with projections 64 reaching the bottom of metal layer 3, sliding can be restrained at the joint if materials are selected so that the joining strength between barrier metal layer 1 and metal layer 3 is reinforced.

Figure 14:
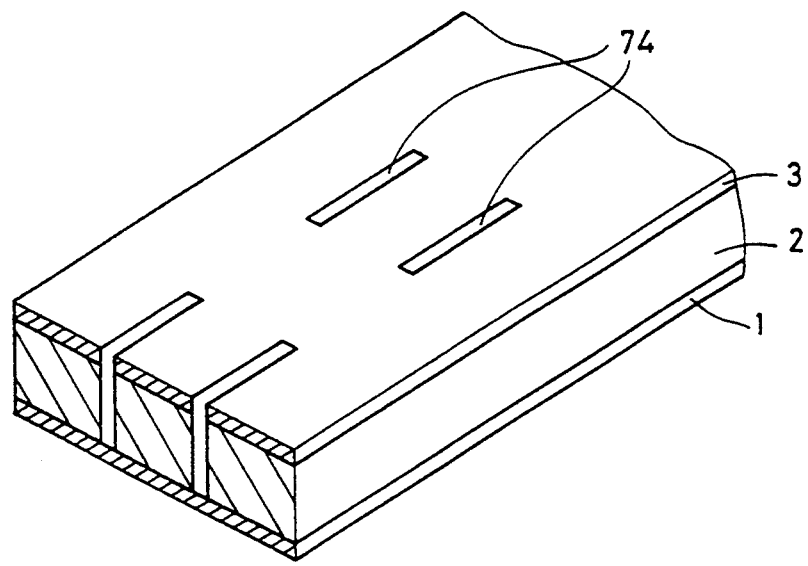
FIG. 14 is a partially sectional perspective view showing a multilayer conductive wire according to a twelfth embodiment of the present invention.

The twelfth embodiment of the present invention will be described in conjunction with FIG. 14. The present multilayer conductive wire includes slit-shaped grooves 74 penetrating aluminum alloy layer 2 and metal layer 3 and extending in the lengthwise direction of the conductive wire without providing grooves to barrier metal layer 1. In the case of the multilayer conductive wire of the present embodiment, an insulating material which is the material for the overlying interlayer insulting film or passivation film fills inside grooves 74 in the formation of the interlayer insulating film or the passivation film. Therefore, electric resistance increases by the amount in accordance with the cross sectional area of grooves 74 at the position where grooves 74 are formed, but strong restraining strength against sliding can be provided by the insulating material filled. Also, by selecting a highly conductive metal for the material of barrier metal layer 1, the increase of the electric resistance due to the formation of grooves 74 can be restricted as much as possible.

Figure 15:
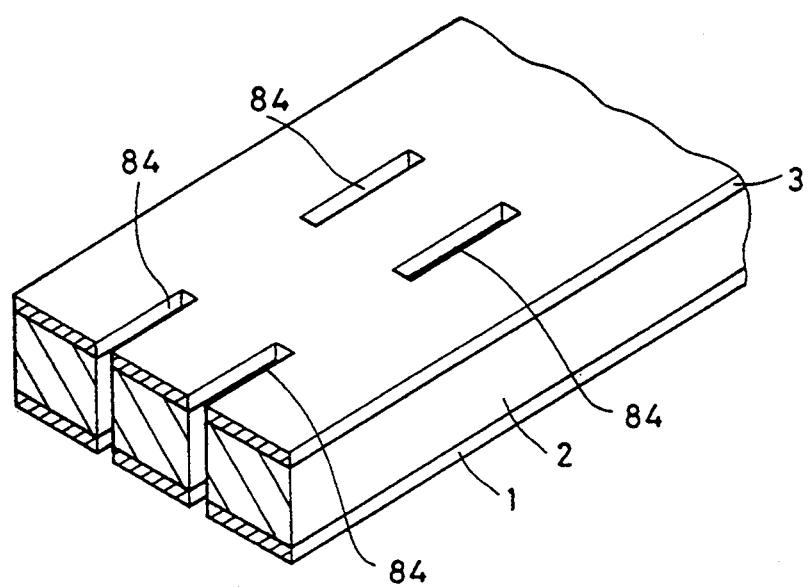
FIG. 15 is a partially sectional perspective view showing a multilayer conductive wire according to a thirteenth embodiment of the present invention.

The thirteenth embodiment of the present invention will be described in conjunction with FIG. 15. The present multilayer conductive wire, referring to FIG. 15, includes slit shaped grooves 84 penetrating all of barrier metal layer 1, aluminum alloy layer 2 and metal layer 3 and extending in the lengthwise direction of the conductive wire. In the present embodiment, an insulating material which is the material for an interlayer insulating film or a passivation film subsequently to be formed fills inside grooves 84, thereby restraining sliding phenomenon due to stress acting in the direction intersecting the lengthwise direction of the conductive wire. With the inside of grooves 84 being filled with the insulating material, if the electric resistance increases by the amount of the cross-sectional area of groove 84, the manufacturing process will be relatively easy by forming groove 84 penetrating the multilayer conductive wire after the wire is formed.

A description will be provided on the limit of the positional relation between a via hole and a groove in order to electrically connecting these wires when the via hole is formed in an interlayer insulating film existing between the multilayer conductive wire of each of the embodiments and other conductive wires.

Figure 4:
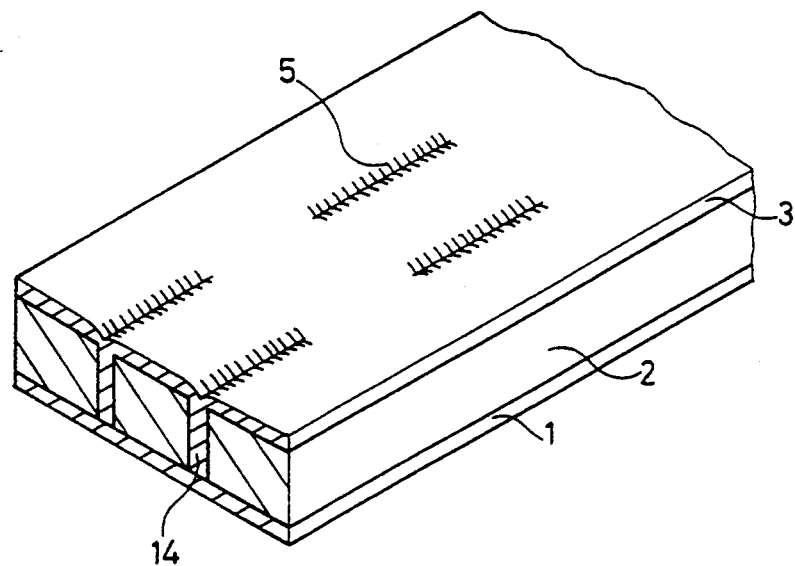
FIG. 4 is a partially sectional perspective view showing a multilayer conductive wire according to a second embodiment of the present invention.
Figure 5:
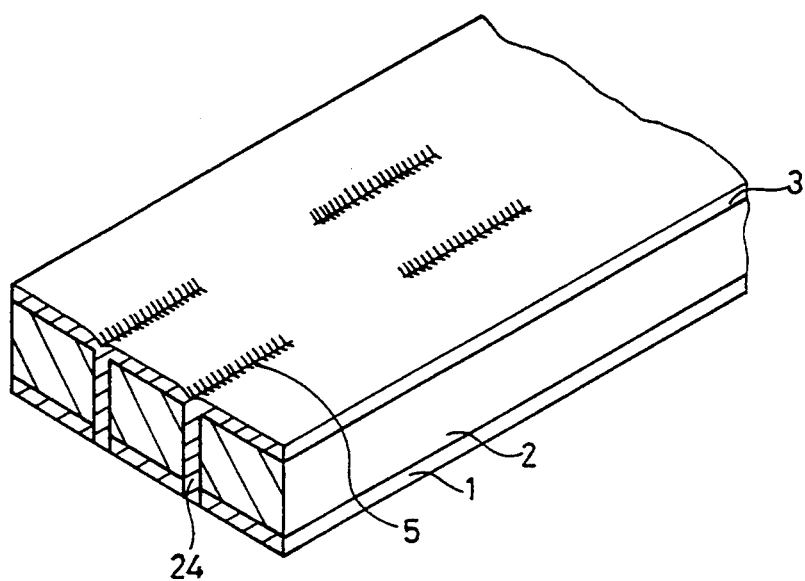
FIG. 5 is a partially sectional perspective view showing a multilayer conductive wire according to a third embodiment of the present invention.
Figure 6:
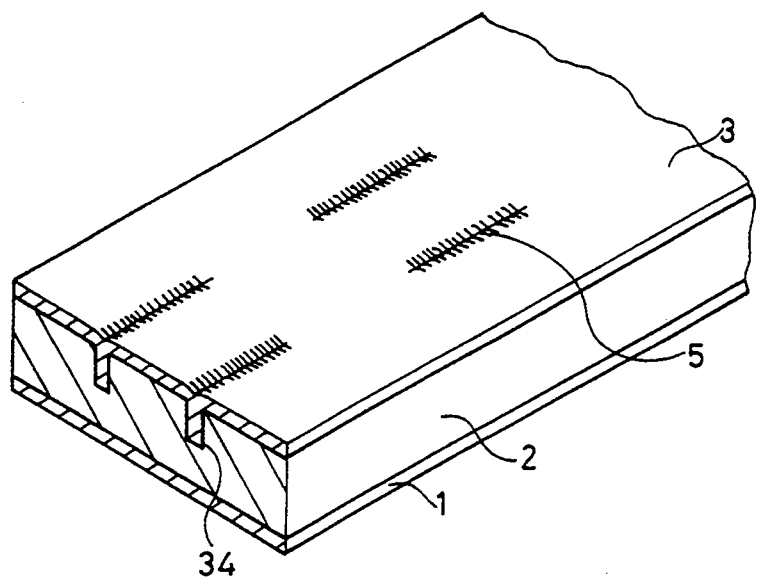
FIG. 6 is a partially sectional perspective view showing a multilayer conductive wire according to a fourth embodiment of the present invention.
Figure 12:
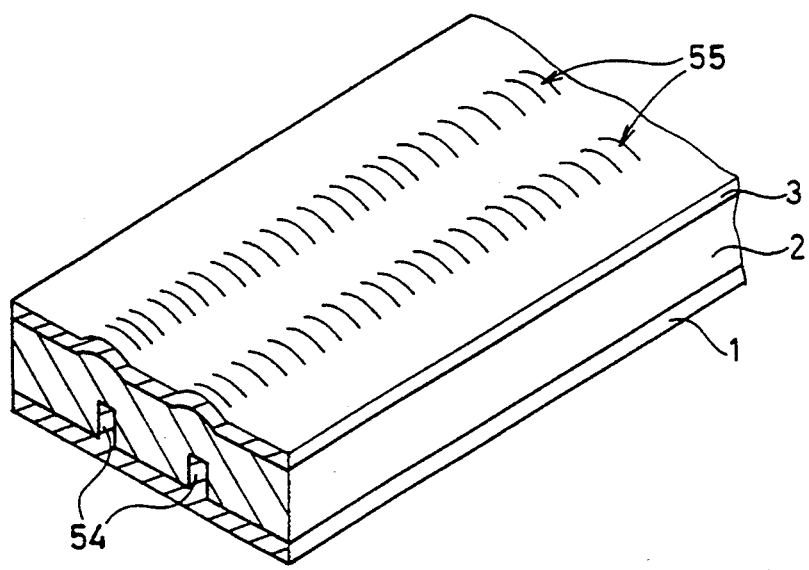
FIG. 12 is a partially sectional perspective view showing a multilayer conductive wire according to a tenth embodiment of the present invention.
Figure 13:
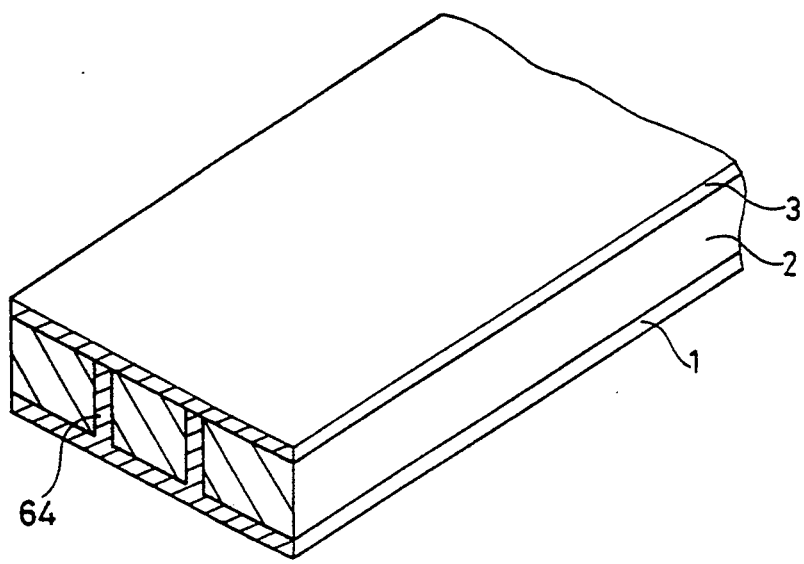
FIG. 13 is a partially sectional perspective view showing a multilayer conductive wire according to an eleventh embodiment of the present invention.

Among the above-stated embodiments, in the cases of the second to fourth embodiments shown in FIGS. 4–6, the tenth embodiment shown in FIG. 12, and the eleventh embodiment shown in FIG. 13, grooves 14, 24, 34 or projections 54, 64 are each filled with a conductive metal other than an aluminum alloy. Therefore, even when the contacts of via holes formed in interlayer insulating films (not shown) covering the surfaces are positioned on the surfaces under which these grooves 14, 24 and 34 or projections 54 and 64 are formed, and at the positions where grooves 14, 24 and 34 or protrusions 54 and 64 are formed, aluminum alloy will not be exposed at the time of overetching the multilayer conductive wire in the process of forming the via holes. Therefore, when via holes are formed at the positions of grooves 14, 24 and 34 or projections 54 and 64, the three conditions necessary for synthesizing a polymer, that is, aluminum alloy, resist and a gas used for etching an oxide film will not be satisfied, so that disconnections, etc. due to polymer synthesization will not take place.

Figure 7:
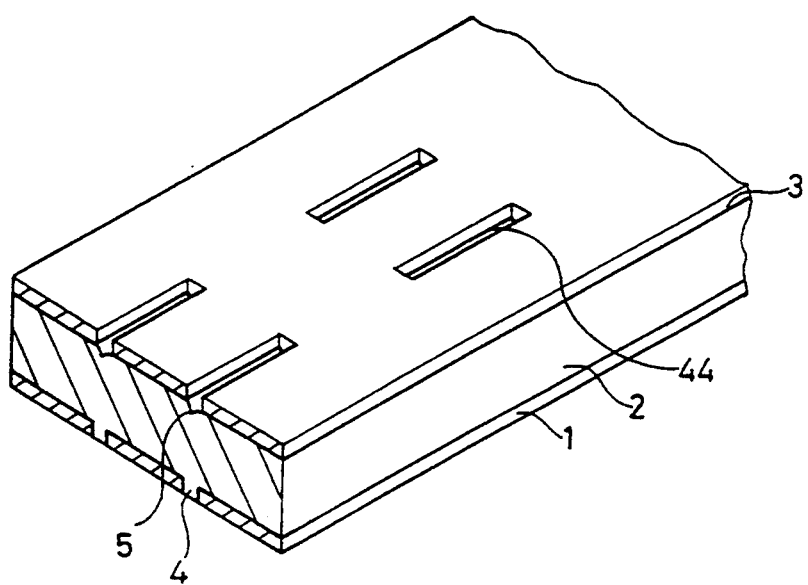
FIG. 7 is a partially sectional perspective view showing a multilayer conductive were according to a fifth embodiment of the present invention.

However, in the case of the first embodiment shown in FIG. 1, when grooves 4 formed in barrier metal layer 1 are filled with aluminum alloy, or as in the case of the fifth embodiment shown in FIG. 7, when grooves 34 formed in metal layer 3 are filled with an oxide film which is an insulator, the following problem is encountered.

Figure 20A:
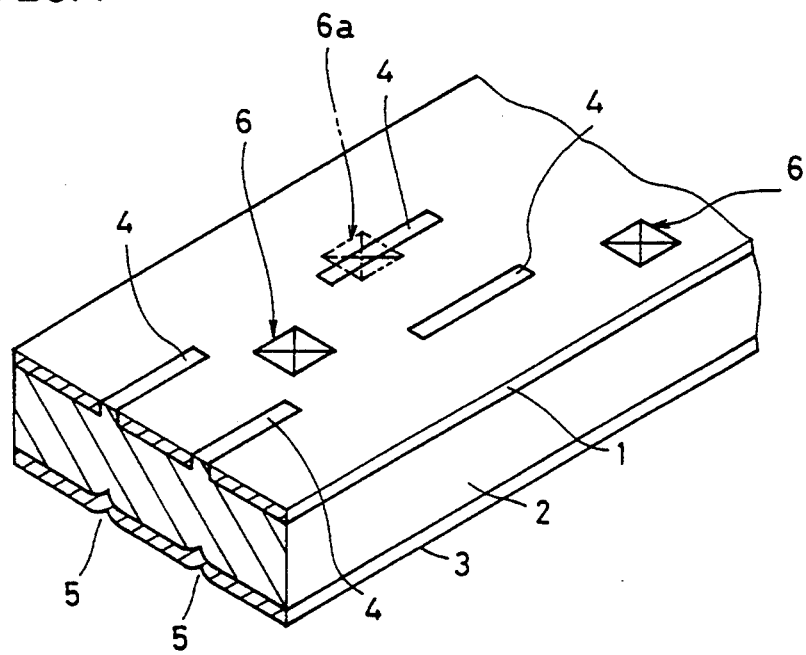
FIG. 20A is a partially sectional perspective view showing the placement of FIG. 1 up side down for illustrating the limit of the position of the contact 6 of a via hole when the via hole is formed in the interlayer insulating film covering the barrier metal layer 1 according to the first embodiment of the present invention.

As shown in FIG. 20A, with the contact 6a of a via hole being positioned at the position represented by the double-dotted chain, aluminum alloy filling the groove 4 will be exposed in overetching of contact 6a which will be necessary in the process of forming the via hole. Thus, the conditions necessary for polymer synthesization are satisfied, which gives rise to a problem such as disconnection associated with the polymer synthesization.

Therefore, in this case, a via hole must be formed at the position of the contact 6 represented by the solid line in FIG. 20A, in other words at the position where groove 4 is not formed.

Figure 20B:
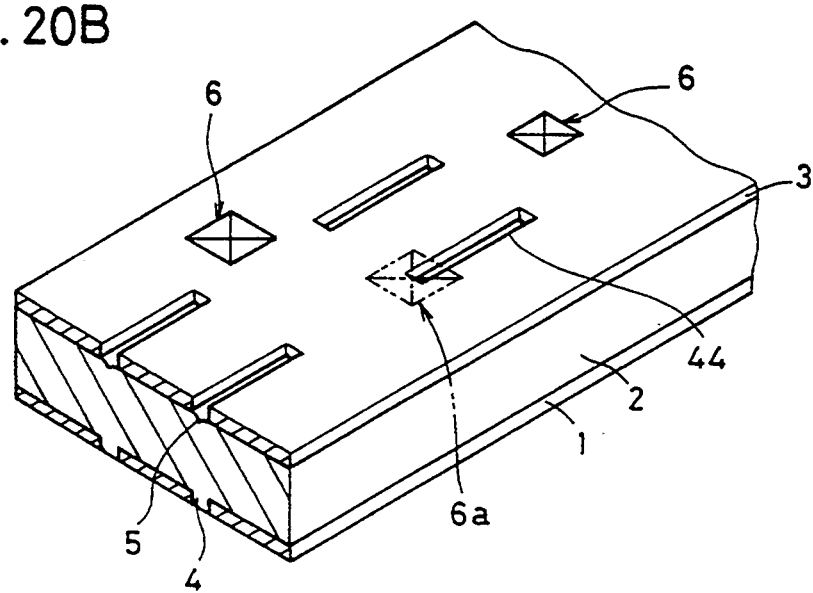
FIG. 20B is a partially sectional perspective view for illustrating the limit of the position of the contact 6 of a via hole when the via hole is formed in the interlayer insulating film covering metal layer 3 according to the fifth embodiment of the present invention.
Figure 21:
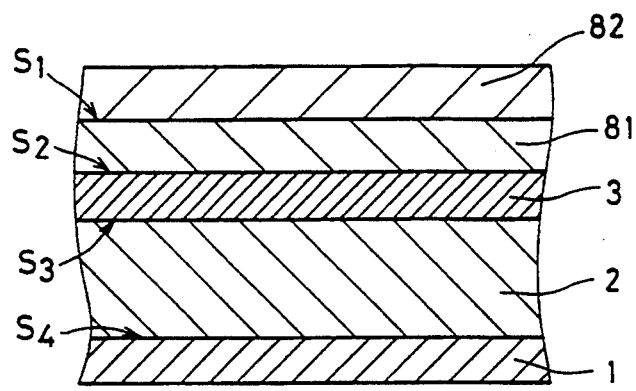
FIG. 21 is a sectional view for illustrating the cause for a sliding phenomenon taking place between the layers in the conventional multilayer conductive wire shown in FIG. 16.

As shown in FIG. 20B, in the case of the multilayer conductive wire according to the fifth embodiment, with the contact 6a of the via hole represented by double-dotted chain positioned overlapping groove 44, an oxide filling groove 44 is quickly etched away in overetching the contact 6a required in the process of forming the via hole, and, therefore, overetching will proceed with the surface of aluminum alloy layer 2 being exposed. Therefore, also in this case, the conditions for polymer synthesization will be satisfied, which gives rise to a problem such as disconnection associated with polymer synthesization.

Also in this case, a via hole must be formed at the position of the contact 6 of the via hole represented by solid line in FIG. 20B, in other words at the position where groove 44 is not formed.

As in the foregoing, a via hole is formed in an interlayer insulating film existing between the multilayer conductive wire of each of the embodiments of the present invention and other conductive wires for their electrical connection at the position which does not overlap the region where grooves 4 and 44, and polymer synthesization in the process of forming the via hole and a problem such as disconnection associated thereto can be prevented.

Figure 22A:
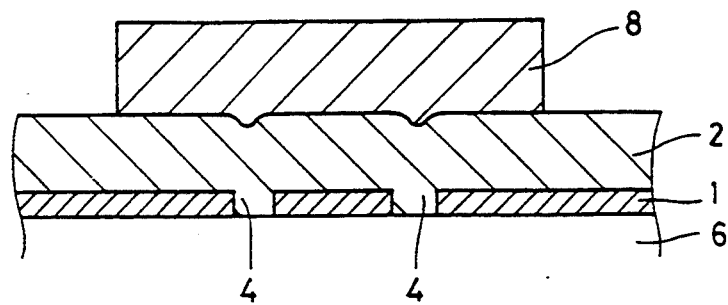
FIGS. 22A and 22B are cross sectional views sequentially showing steps of forming a multilayer conductive wire, when the present invention is applied to a multilayer conductive wire having a two-layer structure.
Figure 22B:
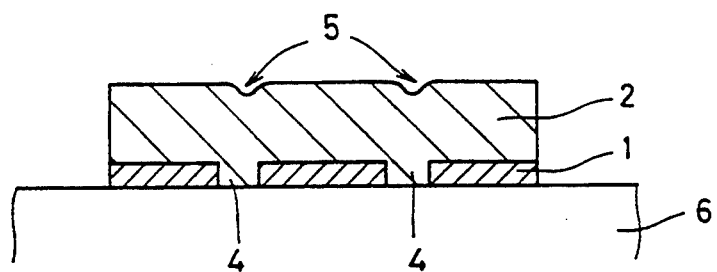
Figure 22C:
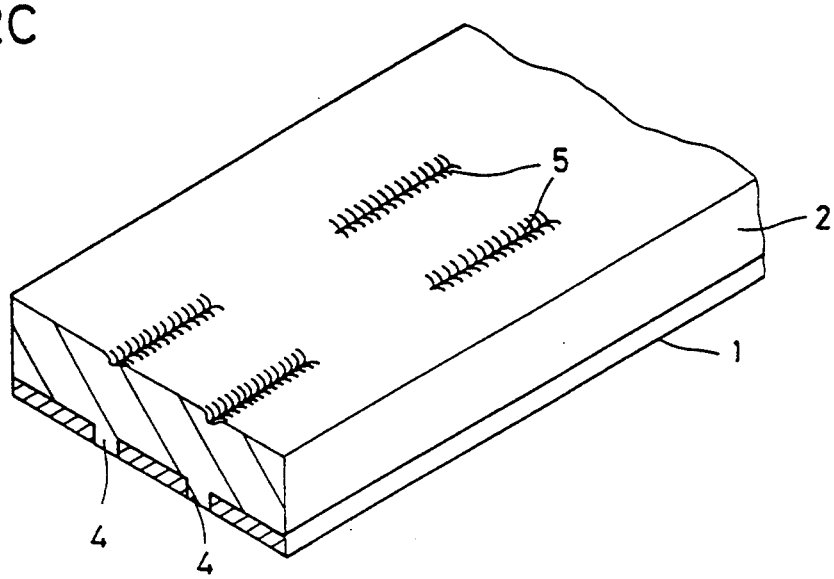
FIG. 22C is a partially cross sectional and perspective view showing the multilayer conductive wire.

Although in the above-stated embodiments, all the multilayer conductive wires described are of a three-layer structure, the present invention can be applied to a multilayer conductive wire of a two-layer structure. In the case of two-layer structure, the metal layer 3 is not formed after the process of the first embodiment shown in FIG. 2C, but resist mask 8 is formed as shown in FIG. 22A, aluminum based alloy layer 2 and barrier metal layer 1 are etched to form a multilayer conductive wire as shown in FIGS. 22B and 22C. Thus structured multilayer conductive wire can effectively be applied to cases in which a notching phenomenon due to the reflection of light on aluminum based alloy layer 2 does not cause a significant problem.

Figure 24:
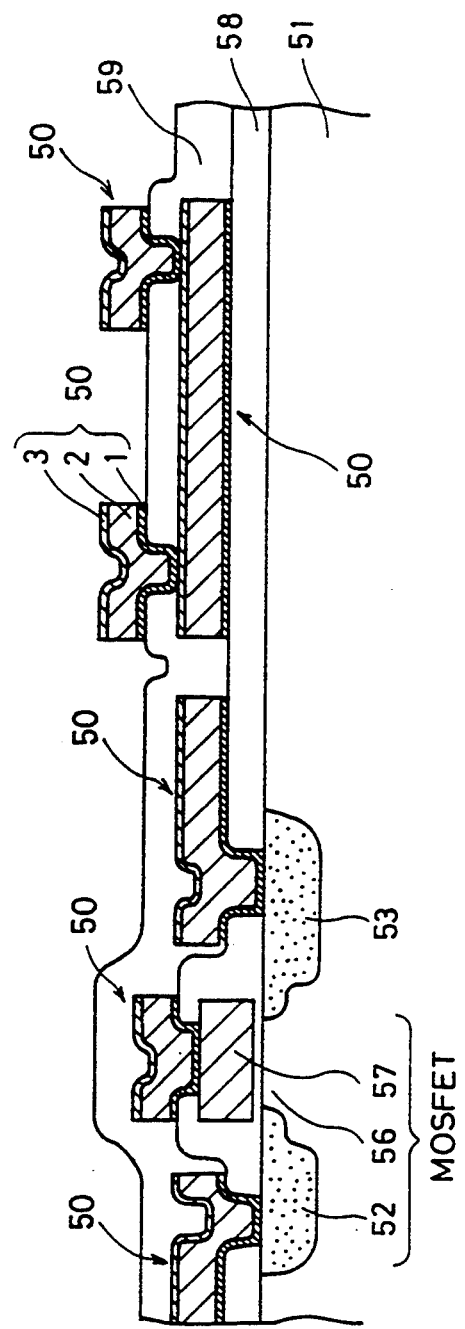
FIG. 24 is a cross sectional view showing an application of a multilayer conductive wire according to the present invention for a conductive wire for use in a semiconductor device including an MOSFET.

Finally, an application of the multilayer conductive wire according to the present invention to a conductive wire for use in a semiconductor device including an MOS (Metal Oxide Semiconductor) type field effect transistor (FET) is illustrated in FIG. 24. In the semiconductor device, referring to FIG. 24, a source region 52 and a drain region 53 formed by impurity implantation are provided on a surface of a semiconductor substrate 51, and a gate electrode 57 is provided in the upper part of a channel region 56 between the source and drain regions. Source region 52, drain region 53 and gate electrode 57 constitute the MOSFET. Further, various conductive layers 50 for electrically connecting the MOSFET and the peripheral devices are formed on an insulating layer 58 covering the surface of a semiconductor substrate 21 and an insulating layer 59 covering the insulating layer 58. Conductive layers 50 each have a multilayer structure of a barrier metal layer 1, an aluminum based alloy layer 2, and a metal layer 3, and the structures of the first through thirteenth embodiments are selectively applied depending upon the condition of thermal stress generated at the time of formation. Accordingly, a sliding phenomenon between the conductive layers attributable to stress such as thermal stress can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multilayer conductive wire subjected to a stress which has a predetermined magnitude distribution in a first direction and is applied in a second direction, comprising:

stacked layers including at least a first conductive layer and a second conductive layer joined with each other at an interface, said stacked layers being oriented relative to said second direction in such a manner as to experience a tendency to slide apart along the interface in response to said stress; and a plurality of elongate grooves of prescribed shape formed in said first conductive layer to extend from the interface of said first conductive layer and said second conductive layer to a prescribed depth into said first conductive layer, and a corresponding plurality of elongate protrusions provided to said second conductive layer with each protrusion extending into and engaging with a respective one of said grooves, wherein said plurality of engaged grooves and corresponding protrusions are disposed with respective portions thereof oriented substantially perpendicular to said second direction to resist the stress and are distributed in a correspondence with said predetermined magnitude distribution of said stress such that more of the engaged grooves and corresponding protrusions are provided where the stress magnitude is relatively high than are provided where the stress magnitude is relatively low.

2. A multilayer conductive wire as recited in claim 1, wherein:

a surface of said first conductive layer opposite to said interface is covered with an oxide film for insulation, and a via hole for electrically connecting said first conductive layer and other conductive wires is formed in said oxide film only in a region free of said grooves.

3. A multilayer conductive wire as recited in claim 1, wherein:

a first portion of said stress is oriented in a third direction and a second portion of said stress is oriented in a fourth direction; and said plurality of grooves comprises first and second sets of cooperating grooves disposed substantially perpendicular to said third and fourth directions respectively so that their respective lengthwise directions are correspondingly oriented in two directions intersecting each other.

4. A multilayer conductive wire as recited in claim 1, wherein:

said first conductive layer includes an aluminum alloy layer, and said second conductive layer includes a metal layer having a smaller light reflectance than the aluminum alloy.

5. A multilayer conductive wire as recited in claim 4, further comprising:

a barrier metal layer formed on an insulating layer and joined to a surface of said first conductive layer opposite to the interface of said first conductive layer and said second conductive layer.

6. A multilayer conductive wire as recited in claim 4, wherein:

said metal layer includes one of W, Mo, Ti and Nb.

7. A multilayer conductive wire as recited in claim 1, wherein:

said first conductive layer includes a metal layer having a smaller light reflectance than aluminum alloy, and said second conductive layer includes an aluminum alloy layer.

8. A multilayer conductive wire as recited in claim 7, further comprising:

a barrier metal layer formed on an insulating layer and joined to a surface of said second conductive layer opposite to the interface of said second conductive layer and said first conductive layer.

9. A multilayer conductive wire as recited in claim 7, wherein:

said metal layer includes one of W, Mo, Ti and Nb.

10. A multilayer conductive wire as recited in claim 1, wherein:

said first conductive layer includes a barrier metal layer formed on an insulating layer, said second conductive layer includes an aluminum alloy layer joined to the surface of said first conductive layer, and a metal layer having a smaller light reflectance than aluminum alloy is joined to the surface of said second conductive layer.

11. A multilayer conductive wire as recited in claim 10, wherein:

said metal layer includes one of W, Mo, Ti and Nb.

12. A multilayer conductive wire subjected to a stress which has a predetermined magnitude distribution in a first direction and is applied in a second direction, having two or more stacked wires including at least a first conductive layer and a second conductive layer joined with each other, wherein:

a plurality of grooves each of a prescribed shape is formed from a surface of said first conductive layer, opposite to an interface of said first conductive layer and said second conductive layer, to a prescribed depth into the first conductive layer;

a surface of one of the conductive layers opposite to the interface is covered with an insulating film layer for securing insulation from other conductive wires; and a corresponding plurality of protrusions provided in said insulating film layer to each engage with a respective one of said grooves, said conductive layers being oriented relative to said second direction in such a manner as to experience a tendency to slide apart along the interface in response to said stress, wherein said plurality of engaged grooves and corresponding protrusions are disposed with respective portions thereof oriented substantially perpendicular to said second direction to resist the stress and are distributed in a correspondence with said predetermined magnitude distribution of said stress such that more of the engaged grooves and corresponding protrusions are provided where the stress magnitude is relatively high than are provided where the stress magnitude is relatively low.

13. A multilayer conductive wire as recited in claim 12, wherein:
a via hole for electrically connecting said first conductive layer and other conductive wires is formed in said insulating film layer only in a region free of said grooves.

14. A multilayer conductive wire as recited in claim 12, wherein:
said first conductive layer includes a metal layer having smaller light reflectance than aluminum alloy, and
said second conductive layer includes an aluminum alloy layer.

15. A multilayer conductive wire as recited in claim 14, wherein:
said metal layer includes one of W, Mo, Ti and Nb.

16. A multilayer conductive wire as recited in claim 12, wherein:
a barrier metal layer formed on an insulating layer is joined to a surface of said first conductive layer opposite to the interface of said second conductive layer and said first conductive layer.

17. A multilayer conductive wire for a semiconductor device subjected to a stress which has a predetermined magnitude distribution in a first direction and is applied in a second direction, comprising:
a first conductive layer on a substrate of said semiconductor device; and
a second conductive layer above and in contact with said first conductive layer,
wherein said first and second conductive layers are interlocked to each other by non-planar regions on the contacting surfaces thereof,
wherein a plurality of elongate grooves of prescribed shape corresponding to said non-planar regions is formed in one of the first and second conductive layers and a correspondingly shaped plurality of protrusions respectively interlocked with said grooves is formed in the other of said first and second conductive layers,
wherein said conductive layers are oriented relative to said second direction in such a manner as to experience a tendency to slide apart along the interface in response to said stress, and
wherein said plurality of engaged grooves and corresponding protrusions are disposed with respective portions thereof oriented substantially perpendicular to said second direction of application of the stress to resist the stress and are distributed in a correspondence with said predetermined magnitude distribution of said stress such that more of the engaged grooves and corresponding protrusions are provided where the stress magnitude is relatively high than are provided where the stress magnitude is relatively low.

18. A semiconductor device subjected to a stress which has a predetermined magnitude distribution in a first direction and is applied in a second direction, comprising:
a substrate;
an insulating layer on said substrate; and
a multilayer conductive layer on said insulating layer,
wherein said multilayer conductive layer includes at least a first conductive layer and a second conductive layer on and in contact with said first conductive layer, and said first and second conductive layers are interlocked to each other by non-planar regions on the contacting surfaces thereof,
said conductive layers being oriented relative to said second direction in such a manner as to experience a tendency to slide apart along the interface in response to said stress,
wherein said plurality of engaged grooves and corresponding protrusions are disposed with respective portions thereof oriented substantially perpendicular to said second direction to resist the stress and are distributed in a correspondence with said predetermined magnitude distribution of said stress such that more of the engaged grooves and corresponding protrusions are provided where the stress magnitude is relatively high than are provided where the stress magnitude is relatively low.

19. The semiconductor device as recited in claim 18, wherein:
said substrate is formed of silicon.

20. The semiconductor device as recited in claim 18, wherein:
said multilayer conductive layer is arranged on a peripheral region of said substrate.

21. The semiconductor device as recited in claim 20, wherein:
said first and second conductive layers are interlocked at corners thereof on said substrate.

22. The semiconductor device as recited in claim 20, wherein:
said first and second conductive layers are interlocked principally at corners thereof on said substrate.

23. The semiconductor device as recited in claim 20, wherein:
said first and second conductive layers are interlocked only at corners thereof on said substrate.

24. In an integrated circuit device including at least an insulating layer, a multilayer conductive wiring layer having a length along a first axis, a width along a second axis, and a thickness along a third axis, said length being substantially larger than each of said width and said thickness, said multilayer conductive wiring layer comprising:
a first conductive sub-layer formed on at least a portion of the insulating layer, said first conductive sub-layer having an upper surface and a lower surface, said lower surface being in contact with said at least a portion of the insulating layer, said first conductive sub-layer further having a plurality of slots formed therethrough from said upper surface to said lower surface, said plurality of slots being oriented along said first axis of said multilayer conductive wiring layer; and
a second conductive sub-layer formed on the top surface of said first conductive sub-layer, said second conductive sub-layer having a plurality of protrusions extending through said plurality of slots in said first conductive sub-layer to contact said insulating layer, wherein said first conductive sub-layer and second conductive sub-layer are mechanically linked through said plurality of slots in said first conductive sub-layer and corresponding protrusions of said second conductive sub-layer extending therethrough.

25. The multilayer conductive wiring layer of claim 24, wherein:
said plurality of slots in said first conductive sub-layer and corresponding protrusions of said second conductive sub-layer are oriented substantially perpendicular to a predetermined direction of application of a main stress so as to resist the main stress.

26. The multilayer conductive wiring layer of claim 25, wherein:
said plurality of slots in said first conductive sub-layer and corresponding protrusions of said second conductive sub-layer are distributed in correspondence with a predetermined magnitude distribution of said applied main stress such that more slots are provided where a magnitude of said main stress is relatively high than are provided where a magnitude of said main stress is relatively low.

27. The multilayer conductive wiring layer of claim 22 wherein:
a first portion of said main stress is oriented in a first direction and a second portion of said stress is oriented in a second direction; and
said second conductive sub-layer further comprises a plurality of second sets of slots disposed substantially perpendicular to said second direction.

28. In an integrated circuit device including at least an insulating layer and a multilayer conductive wiring layer having a length substantially larger than each of a width and a thickness, said multilayer conductive wiring layer comprising:
a first conductive sub-layer formed on at least a portion of the insulating layer, said first conductive sub-layer having an upper surface and a lower surface, said lower surface being in contact with said at least a portion of the insulating layer, said first conductive sub-layer further having a first plurality of slots formed therethrough from said upper surface to said lower surface;
a second conductive sub-layer formed on the upper surface of said first conductive sub-layer, a portion of said second conductive sub-layer contacting said insulating layer through said first plurality of slots in said first conductive sub-layer;
wherein said first conductive sub-layer and said second conductive sub-layer are mechanically linked through said first plurality of slots in said first conductive sub-layer and said portion of said second conductive sub-layer.

29. A multilayer conductive wire structure formed over an insulating layer, comprising:
a first conductive layer formed on a surface of the insulating layer;
a second conductive layer formed on the first conductive layer to a selected thickness, a plurality of first grooves being formed through the thickness of the second conductive layer; and
a third conductive layer formed on the second conductive layer and extending into said plurality of first grooves through the thickness of the second conductive layer so as to contact the first conductive layer, whereby the second and third conductive layers are interlocked to one another by material of the third conductive layer extending through the first grooves in the second conductive layer.

30. The multilayer wiring structure according to claim 29, wherein:
a plurality of second grooves are formed in the first conductive layer in correspondence with the plurality of first grooves formed in the second conductive layer, and material of the third conductive layer extends through the first grooves in the second conductive layer and through corresponding second grooves in the first conductive layer,
whereby the second and third conductive layers are mechanically interlocked with each other and with the first conductive layer by the presence of material of the third conductive layer extending into the second and first grooves in both of the first and second conductive layers respectively.

31. The multilayer conductive wire structure formed over an insulating layer, comprising:
a first conductive layer formed on a surface of the insulating layer;
a second conductive layer formed on the first conductive layer to a selected thickness, a plurality of grooves being formed part way into the selected thickness from an outer surface of the second conductive layer; and
a third conductive layer formed on the outer surface of the second conductive layer and extending into said plurality of grooves of the second conductive layer to fill said grooves, whereby the second and third conductive layers are interlocked to one another by material of the third conductive layer extending into the plurality of grooves in the second conductive layer.

32. In an integrated circuit device including at least an insulating layer and a multilayer conductive wiring layer having a length substantially larger than each of a width and a thickness, said multilayer conductive wiring layer comprising:
a conductive sub-layer formed on at least a portion of the insulating layer, said conductive sub-layer having an upper surface and a lower surface, said lower surface being in contact with said at least a portion of the insulating layer, said conductive sub-layer further having a plurality of slots formed therethrough from said upper surface to said lower surface;
an insulating sub-layer formed on the upper surface of said conductive sub-layer, a portion of said insulating sub-layer extending through said plurality of slots in said conductive sub-layer and contacting said insulating layer;
wherein said conductive sub-layer and said insulating sub-layer are mechanically linked through said plurality of slots in said conductive sub-layer and said portion of said insulating sub-layer extending therethrough.

33. A conductive multilayer wiring structure formed on a surface of an insulating layer, comprising:
a first conductive layer formed on a portion of said surface of said insulating layer, with a first plurality of slots formed through a thickness of the first conductive layer;
a second conductive layer formed on said first conductive layer, said second conductive layer having formed therein a second plurality of slots parallel to and non-overlappingly located relative to the slots in said first conductive layer; and a third conductive layer formed on said second conductive layer, with material of the third conductive layer extending into and through a thickness of the second conductive layer so as to contact corresponding portions of said first conductive layer, whereby said first, second and third conductive layers are sequentially interlocked to each other by said slots and materials extending therethrough.

34. The multilayer wiring structure according to claim 29, wherein:

said first conductive layer is formed to have a plurality of transverse grooves which are oriented in a direction perpendicular to an orientation of said first grooves in said second conductive layer, with material of said second conductive layer extending into said transverse grooves of the first conductive layer.

35. A multilayer conductive wiring structure formed on a surface of an insulating layer, comprising:

a first conductive layer formed on a portion of said surface of said insulating layer, with a plurality of projections formed on a surface of the first conductive layer along a lengthwise direction thereof; and a second conductive layer formed on said surface of said first conductive layer so as to cover and extend between said plurality of projections formed thereon, whereby said first and second conductive layers are mechanically interlocked by coaction between said plurality of projections of said first conductive layer and said second conductive layer extending between and covering the same.

36. The multilayer wiring structure according to claim 35, wherein:

said second conductive layer is formed to a thickness exceeding a height of said plurality of projections of said first conductive layer, and has an upper surface comprising protrusions corresponding to individual ones of said projections of said first conductive layer.

37. A conductive multilayer wiring structure formed on a surface of an insulating layer, comprising:

a first conductive layer formed on a portion of said surface of said insulating layer, with a plurality of elongate lengthwise protrusions formed on a surface of the first conductive layer to a first height;

a second conductive material deposited on said first conductive material, including portions of said first conductive layer between adjacent projections thereof, such that said second conductive material is provided to a thickness equal to that of said projections; and a third conductive layer formed on said second conductive layer and said projections of said first conductive layer.

38. A multilayer conductive wiring structure formed on a surface of an insulating material, comprising:

a first conductive material formed on a portion of said surface of said insulating layer;

a second conductive layer formed on said first conductive layer; and a third conductive layer formed on a surface of said second conductive layer;

with a plurality of grooves formed through a total thickness of said second and third conductive layers taken together.

39. The multilayer wiring structure according to claim 38, wherein:

said first conductive layer is provided with grooves extending through a thickness thereof and in respective correspondence with said grooves formed in said second and third conductive layers.

* * * * *